US010347534B2

(12) United States Patent
Lapke et al.

(10) Patent No.: US 10,347,534 B2
(45) Date of Patent: Jul. 9, 2019

(54) VARIABLE STEALTH LASER DICING PROCESS

(71) Applicant: NXP B.V., Eindhoven (NL)

(72) Inventors: Martin Lapke, Hamburg (DE); Hartmut Buenning, Hamburg (DE); Sascha Moeller, Hamburg (DE); Guido Albermann, Hamburg (DE); Michael Zernack, Hamburg (DE); Leo M. Higgins, III, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/701,849

(22) Filed: Sep. 12, 2017

(65) Prior Publication Data

US 2019/0080963 A1 Mar. 14, 2019

(51) Int. Cl.
*H01L 21/78* (2006.01)
*H01L 21/268* (2006.01)
*H01L 21/304* (2006.01)
*H01L 21/683* (2006.01)

(52) U.S. Cl.
CPC ............ *H01L 21/78* (2013.01); *H01L 21/268* (2013.01); *H01L 21/304* (2013.01); *H01L 21/6836* (2013.01); *H01L 2221/6834* (2013.01); *H01L 2221/68336* (2013.01)

(58) Field of Classification Search
CPC ................. H01L 21/78; H01L 21/6836; H01L 21/67092; H01L 21/268; H01L 2221/68327; H01L 23/544
See application file for complete search history.

(56) References Cited

U.S. PATENT DOCUMENTS

| 7,968,432 B2 * | 6/2011 | Tamura | B23K 26/0608 438/463 |
| 8,258,046 B2 * | 9/2012 | Ueki | B23K 26/364 438/463 |
| 9,018,080 B2 | 4/2015 | Furuta | |
| 2004/0002199 A1 * | 1/2004 | Fukuyo | B23K 26/03 438/460 |
| 2005/0006361 A1 * | 1/2005 | Kobayashi | B23K 26/0676 219/121.73 |
| 2006/0108338 A1 * | 5/2006 | Nishiwaki | B23K 26/38 219/121.72 |
| 2009/0121337 A1 | 5/2009 | Abe et al. | |
| 2011/0056922 A1 * | 3/2011 | Ueki | B23K 26/364 219/121.72 |
| 2011/0287607 A1 | 11/2011 | Osako et al. | |
| 2015/0069578 A1 | 3/2015 | Buenning et al. | |
| 2017/0257075 A1 * | 9/2017 | Abatake | H03H 3/02 |

\* cited by examiner

*Primary Examiner* — Zandra V Smith
*Assistant Examiner* — John M Parker
(74) *Attorney, Agent, or Firm* — Senaida B. San Miguel (57) ABSTRACT

Embodiments are provided herein for separating integrated circuit (IC) device die of a wafer, the wafer having a front side with an active device region and a back side, the active device region having a plurality of active devices arranged in rows and columns and separated by cutting lanes, the method including: attaching the front side of the wafer onto a first dicing tape; forming a modification zone within each cutting lane through the back side of the wafer, wherein each modification zone has a first thickness near a corner of each active device and a second thickness near a center point of each active device, wherein the second thickness is less than the first thickness; and propagating cracks through each cutting lane to separate the plurality of active devices.

16 Claims, 7 Drawing Sheets

VARIABLE STEALTH LASER DICING PROCESS

BACKGROUND

Field

This disclosure relates generally to separation of devices on a wafer, and more specifically, to a laser system having variable power and variable focus for separation of devices on a wafer.

Related Art

Integrated circuits (ICs) are typically produced by forming a plurality of ICs on a semiconductor substrate, such as a silicon wafer. The ICs include one or more layers formed on the wafer (e.g., semiconductor layers, insulation layers, and metallization layers). The ICs are usually arranged in rows and columns on the wafer and are separated from one another by a number of cutting lanes in the row and column directions. The finished ICs on the wafer are then separated into individual ICs by, for example, sawing the wafer along the cutting lanes. Sawing may be performed using various mechanical cutting and laser cutting methods. However, mechanical cutting tools like blades often tend to cause chipping of the back side of a wafer, and laser cutting tends to cut unevenly through different material layers formed on the wafer.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

As known in the art, laser cutting involves using a laser beam to cut through the silicon between integrated circuits (ICs) of a wafer. Laser cutting requires that the laser beam have a sufficient power to melt, burn, or vaporize the silicon in the cutting lanes of the wafer to remove the silicon in the cutting lanes and physically separate the ICs from one another (i.e., laser cutting forms sidewalls of neighboring ICs that are separated from one another by a gap in the cutting lane). By contrast, a different approach for separating ICs is stealth laser dicing, where a laser beam focuses into the monocrystalline silicon in the cutting lanes of the wafer (i.e., below the surface of the silicon) and melts a portion of the monocrystalline silicon in the cutting lanes, without removing the monocrystalline silicon. The melted monocrystalline silicon then re-crystallizes into polycrystalline silicon, which induces stress into the wafer due to a higher volume of the polycrystalline structure, creating a crack that propagates to top and bottom surfaces (also referred to as major surfaces) of the wafer between each IC. This area of polycrystalline silicon is also referred to as a modification zone.

The separated ICs are device die that may be used in various packaged semiconductor devices, such as in a radio frequency identification device (RFID) tag. RFID tags are typically small devices that include an embedded integrated circuit. RFID tags also include an antenna for communication via RF signals. During the device assembly process, sidewall stresses occurring from the wafer separation will accumulate in the assembled device die. For example, when stealth laser dicing is used for device die separation, there may be a portion of the modification zone (or polycrystalline silicon) that remains on the sidewalls of each device die, which are more vulnerable to stress as compared with the monocrystalline silicon.

RFID tags are often implemented in smart cards devices that may be small enough to fit in a user's pocket. Smart cards are typically pocket-sized cards that have embedded integrated circuits. Smart cards may include external electrical contacts for communication, or may be contactless, such as using RF induction technology. RFID tags and other packaged devices undergo various mechanical stresses during their lifetime, such as bending and crushing forces, where these forces may be transferred through the packaged device to the sidewalls of the device die. As a result, unintended cracks may begin to develop in the modification zones of the device die and propagate into active areas of the device die, and may even break active circuitry or electrical connections of the packaged device.

Figure 1:
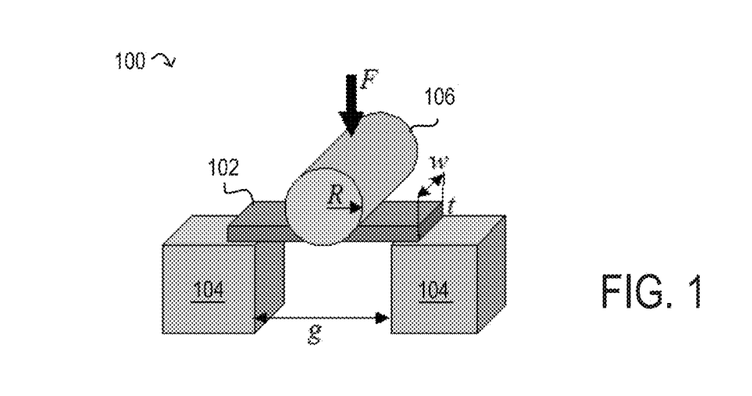
FIGS. 1 and 2 illustrate block diagrams depicting aspects of an example mechanical stress system to test device die.

FIG. 1 illustrates an example mechanical stress testing system 100. The system 100 is used to test a component 102, such as an individual device die itself. Component 102 lies in an x-y plane and has length l measured in an x-direction (e.g., left to right or horizontal direction on the page), a width w measured in a y-direction (e.g., into and out of the page) and a thickness t measured in a z-direction (e.g., top to bottom or vertical direction on the page). The stress testing system 100 is used to test the amount of mechanical stress or force that the component 102 can withstand before breakage (also referred to as fracture strength). The system 100 implements bending and crushing forces similar to those experienced by a device die in the field (e.g., bent and crushed in a user's pocket or wallet). The system 100 includes blades 104 separated by a distance g in the x-direction, where the blades 104 support opposite ends of the component 102. The system 100 also includes a roller 106 having a radius R that rolls across the component 102 from one end of the component 102 to the opposite end (e.g., in the x-direction) while simultaneously applying a force F downward on the component 102 (e.g., in the z-direction).

Figure 10:
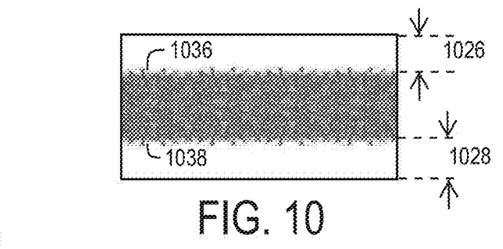
FIG. 10-15 illustrate block diagrams depicting example modification zones that can be implemented by the laser system of FIGS. 8 and 9, according to some embodiments.

It is noted that an example sidewall of the component 102 is represented in FIG. 10, which shows a modification zone of polycrystalline silicon (shown in grey) located between a top layer and a bottom layer of monocrystalline silicon (shown in white). The thicknesses of the monocrystalline silicon layers and the polycrystalline silicon layer are substantially uniform across the sidewall.

Figure 2:
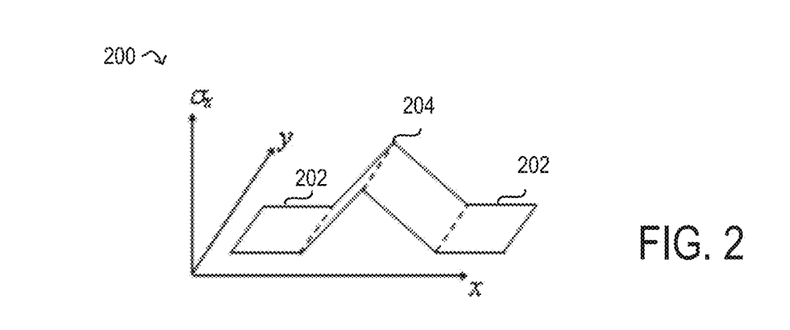

FIG. 2 illustrates an example stress profile 200 of the component 102 that results from the force F applied by system 100. The x-y plane of the profile 200 corresponds to the x-y plane of the component 102 shown in FIG. 1. The stress profile 200 shows the amount of stress experienced by the component 102 in the vertical direction labeled sigma (x), or $\sigma(x)$. As shown in the stress profile 200, the component 102 experiences minimal stress 202 near the ends of the component 102. The stress profile 200 also shows that the component 102 experiences its maximum stress 204 near the center point of the component 102. In other words, the fracture strength of the component 102 (or device die) is at its weakest at the center point, which is in part due to its weakened sidewalls that include remnants of the modification zone. Fracture strength is an important aspect for assembling device die into a flexible package, such as smart card, RFID, or label products, due to the risk of die breakage by bending stress applied to the assembled product during use in the field (e.g., product handling by user), which propagates to the device die.

The present disclosure provides an approach to device die separation that increases the fracture strength of device die that are separated by stealth laser dicing. In order to increase fracture strength of a device die at the center point, the present disclosure provides for creating modification zones using oscillating laser power, oscillating focus position, or both. In some embodiments, a modification zone may be formed using a laser beam having reduced power near the center point of each sidewall of a device die, as compared with the greater laser power corresponding to the sidewall's ends, where the resulting modification zone is thinner near each sidewall's center point. In some embodiments, a modification zone may be formed by moving the focal point of the laser beam deeper into the silicon near the center point of each sidewall of a device die, as compared with the shallower focal point position corresponding to the sidewall's ends, where the resulting modification zone has a top boundary that dips deeper into the silicon near the sidewall's center point. In some embodiments, both approaches may be implemented to maximize the fracture strength of the device die at the center point.

As a result, the present disclosure provides improved fracture strength of the die at its center point (e.g., the amount of stress 204 experienced by the device die at its center point is reduced) by decreasing the amount of polycrystalline silicon present at the center point of each sidewall (e.g., thinner modification zone), by increasing the amount of monocrystalline silicon present at a fracture point near the center point of each sidewall (e.g., deeper modification zone), or both. The present disclosure also maintains relatively large modification zones at the die intersections (e.g., near each sidewall's ends, or near the corners of each device die) in order to achieve proper device die separation.

Example Embodiments

Figure 3:
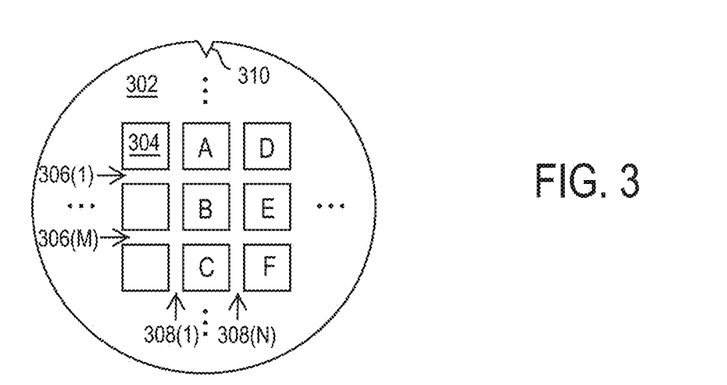
FIG. 3-7 illustrates block diagrams depicting example steps of a variable stealth laser dicing process in which the present disclosure is implemented, according to some embodiments.

FIG. 3 illustrates a top-down view (e.g., showing the x-y plane) of an example semiconductor wafer 302 (also referred to as simply wafer 302). Wafer 302 includes a plurality of device die 304 that are arranged into a number of rows and columns in the x-direction (e.g., horizontal) and y-direction (e.g., vertical). The device die 304 are separated from one another by cutting lanes 306(1)-(M) in the x-direction and cutting lanes 308(1)-(N) in the y-direction. It is noted that cutting lanes utilized for stealth laser dicing may be thinner than cutting lanes utilized for mechanical separation (e.g., cutting lanes 306 and 308 may each have a width of about 15 microns, as compared with cutting lanes having a width of about 80 microns for mechanical sawing). A number of example device die 304 are labeled with letters A-F in order to show physical layout relationships between neighboring device die, as discussed below. Wafer 302 also includes notch 310, which is used to align the wafer 302 for various steps of the variable stealth laser dicing process discussed herein.

Figure 4:
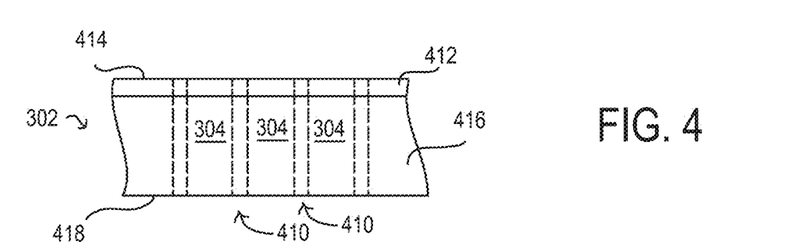

FIG. 4 illustrates a cross-sectional view of wafer 302 that bisects any number of device die 304 that are separated by cutting lanes 410. It is noted that in this drawing and in the remaining subsequent drawings, the cross-sections of cutting lanes 410 are representative of all cross-sections of cutting lanes 306(1)-(M) and 308(1)-(N) in either the x- or y-directions. For example, the cross-sectional view of FIG. 4 may be taken in the y-direction through device die A, B, and C, where the cross-sections of cutting lanes 410 correspond to cross-sections of cutting lanes 306(1)-(M). In another example, the cross-sectional view of FIG. 4 may be taken in the x-direction through device die C and F, where the cross-sections of cutting lanes 410 correspond to cross-sections of cutting lanes 308(1)-(N).

Each device die 304 of wafer 302 includes an active device region 412, which includes active circuitry. Wafer 302 has a front side 414 and an opposite back side 418, where the active device region 412 is located at the front side 414 of the wafer 302, and bulk silicon 416 is located at the back side 418 of the wafer 302. In the embodiments discussed herein, bulk silicon 416 includes monocrystalline silicon at least within the cutting lanes 410. Wafer 302 is shown in a face-up orientation, with front side 414 of the wafer 302 shown facing an upward direction.

Wafer 302 described herein can generally be any semiconductor material or combinations of materials, such as gallium arsenide, silicon germanium, silicon-on-insulator (SOI), silicon, monocrystalline silicon, the like, and combinations of the above. The active circuitry included in the active device region 412 for the plurality of device die 304 on wafer 302 is formed using a sequence of numerous process steps applied to semiconductor wafer 302, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components implemented in the active circuity include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

Figure 5:
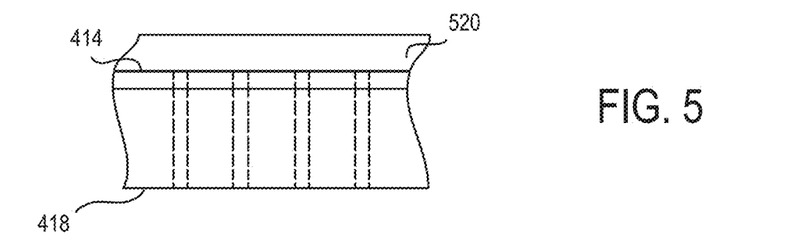
Figure 6:
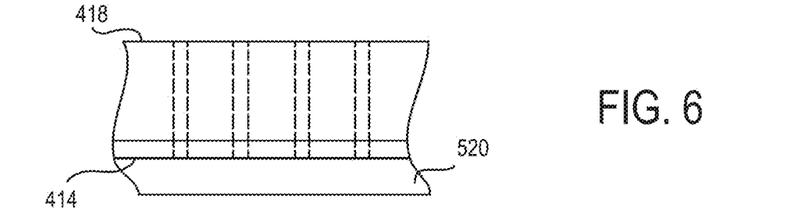
Figure 7:
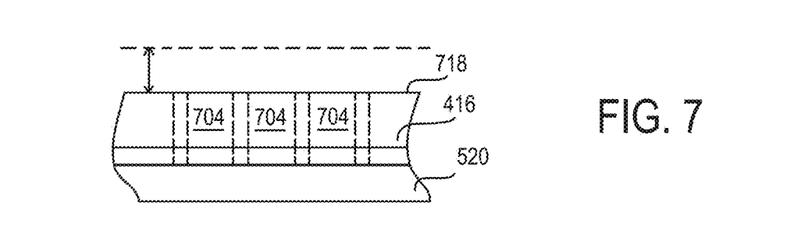

FIG. 5-7 show various steps of a variable stealth laser dicing process, as further discussed herein. FIG. 5 illustrates a cross-sectional view of wafer 302 after mounting the front side 414 of the wafer 302 to an adhesive tape 520. In some embodiments, adhesive tape 520 is formed from a polymer film such as PVC (polyvinyl chloride), polyolefin, polyethylene, or similar material, where a die adhesive is placed on a surface of the polymer film that attaches to the front side 414 of the wafer. In some embodiments, adhesive tape 520 is implemented as a protective foil that protects the active device region 412 at the front side 414 from damage during remaining steps of the variable stealth laser dicing process. In some embodiments, adhesive tape 520 is implemented as a dicing tape that is further stretchable in the row and column directions (e.g., in the x- and y-directions) in order to propagate cracks between the die 304 after dicing, as further discussed below. In some embodiments, the adhesive tape 520 is removable in response to UV (ultraviolet light) exposure or temperature excursion (e.g., the die adhesive weakens in response to the UV exposure or temperature excursion). In some embodiments, adhesive tape 520 includes a release layer to release the wafer or the resulting die from the adhesive tape 520.

FIG. 6 illustrates a cross-sectional view of wafer 302 after flipping the wafer 302 to a face-down orientation, with front side 414 of the wafer 302 shown facing in a downward direction. FIG. 7 illustrates a cross-sectional view of wafer 302 after backgrinding the wafer 302, which removes a portion of the bulk silicon 416 from the back side 418 of the wafer 302 (shown as the dashed line) to reduce the thickness of the wafer 302, resulting in a plurality of device die 704 that are thinner than original device die 304 and achieve a final thickness suitable for assembly into product. The backgrinding reveals a new back side 718 of the (thinner) wafer 302. For example, the original thickness of the wafer 302 may range from 675 microns (e.g., for a six-inch or 150 mm wafer) to 725 microns (e.g., for an eight-inch or 200 mm wafer), to 775 microns (e.g., for a twelve-inch wafer). The new thickness of the wafer 302 after backgrinding may range from less than 40 microns to about 250 microns.

Figure 8:
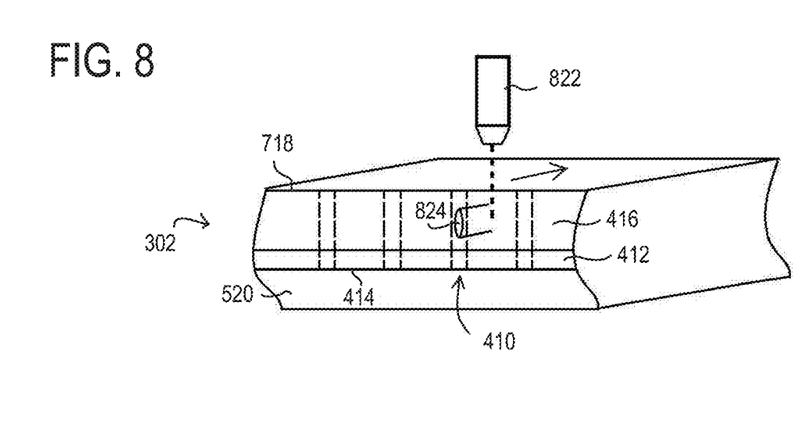
FIGS. 8 and 9 illustrate block diagrams depicting an example laser system forming a modification region in a cutting lane of a wafer according to the variable stealth laser dicing process in which the present disclosure is implemented, according to some embodiments.

FIG. 8 illustrates a three-dimensional cross-sectional view of wafer 302 during formation of a modification zone 824 by an example laser system 822 (represented by laser 822) in a present cutting lane 410 of wafer 302. The path of the laser 822 is illustrated by an arrow in the direction into the page (e.g., in the x- or y-direction). As shown in FIG. 8 (and FIG. 9), the laser beam provided by laser 822 is illustrated by a broken line and has a focal point shown as the end point of the broken line positioned within the remaining portion of bulk silicon 416 of the wafer 302. With the wafer 302 in a face-down orientation, the laser 822 focuses at a depth into the wafer 302 through the back side 718 within present cutting lane 410. The laser 822 moves along the path within the present cutting lane 410 and melts the monocrystalline silicon within a zone around the focal point of the laser 822, which re-crystallizes into polycrystalline silicon to form modification zone 824, also referred to as a heat zone. The focal point and heat zone are discussed below in further detail in connection with FIG. 24. In other words, the path of the focal point forms a midline of the modification zone 824, as further discussed below in connection with FIG. 13-15.

Figure 9:
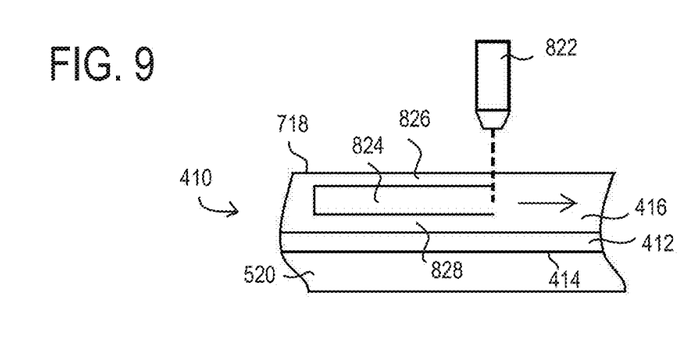

It is also noted that FIG. 8 and FIG. 9 show the laser processing being performed from the back surface (or back side 718) of the wafer 302. In other embodiments, the laser processing may be performed from the top surface (or front side 414) of the wafer 302, where the wafer 302 (resulting from the backgrinding step shown in FIG. 7) would have its back side 718 mounted to or attached to a dicing tape (like dicing tape 520 shown in FIG. 8) and would be placed in the laser system 822 in a face-up orientation. The laser system 822 would perform the laser processing as described in FIG. 8 and FIG. 9.

FIG. 9 illustrates a perpendicular cross-sectional view of the present cutting lane 410 along the path of the laser 822. Similarly, the path of the laser 822 is illustrated by an arrow and the wafer 302 remains in a face-down orientation. The modification zone 824 is positioned between the front side 414 and back side 718 of the wafer 302, with a remaining monocrystalline silicon layer 828 (which may also be referred to as top silicon layer 828, since it is closest to the front side 414) and a remaining monocrystalline silicon layer 826 (which may also be referred to as bottom silicon layer 826, since it is closest to the back side 718) above and below the modification zone 824. In the embodiment shown, modification zone 824 is positioned near the middle of the bulk silicon 416 (e.g., relatively half-way between back side 718 and active device region 412), but may be positioned closer to the active device region 412 or closer to the back side 718 while remaining within the bulk silicon 416 in other embodiments. It is noted that the modification zone 824 shown in FIGS. 8 and 9 is representative of a modification zone formed in accordance with the present disclosure, which is differently shaped than the one shown in FIGS. 8 and 9 (e.g., a modification zone having an oscillating midline or oscillating thickness, or otherwise non-rectangular cross-sectional profile). Additional aspects about the laser system 822 used to form the modification zone 824 are further discussed in connection with FIG. 22-24 and FIG. 27-28.

Figure 16:
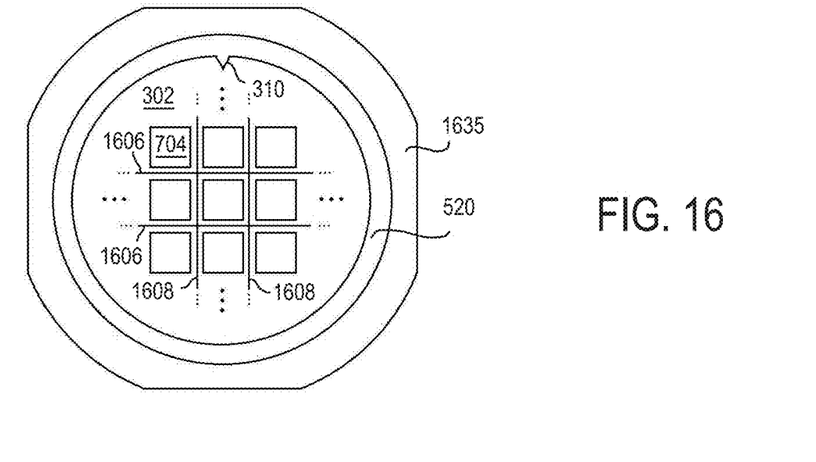
FIG. 16-17 illustrate block diagrams depicting additional steps of the variable stealth laser dicing process in which the present disclosure is implemented, according to some embodiments.

FIG. 10 shows a perpendicular cross-sectional view (in a face-down orientation like that shown in FIG. 9) of a portion of an example modification zone formed in bulk silicon 416, which is used to separate device die in a stealth laser dicing process without varying the power or focal point position of the laser 822. The portion of the modification zone shown in FIG. 10 is formed in the present cutting lane 410 along the length of a device die 704 (where the resulting modification zones and die 704 are also shown in FIG. 16), which may also be referred to as a portion of a modification zone formed along the sidewall of a device die 704. The modification zone has a relatively flat first boundary 1036 and a relatively flat second boundary 1038 in the direction of the present cutting lane 410, which allows thickness 1026 of the remaining monocrystalline silicon layer 826 and thickness 1028 of the remaining monocrystalline silicon layer 828 to be substantially uniform in the present cutting lane 410 along the entirety of the sidewall. It is noted that when a stealth laser dicing process (and the variable stealth laser dicing process, discussed below) is used, the separated device die will have a corresponding remnant of the modification zone on its sidewalls. As discussed above, any remnant of the modification zone that remains on the sidewall after dicing is vulnerable to mechanical stress. As a result, the device die having this modification zone present on its sidewalls may be susceptible to fracture when mechanical stress is applied near the center of the device die, due to the weakened sidewalls.

Figure 13:
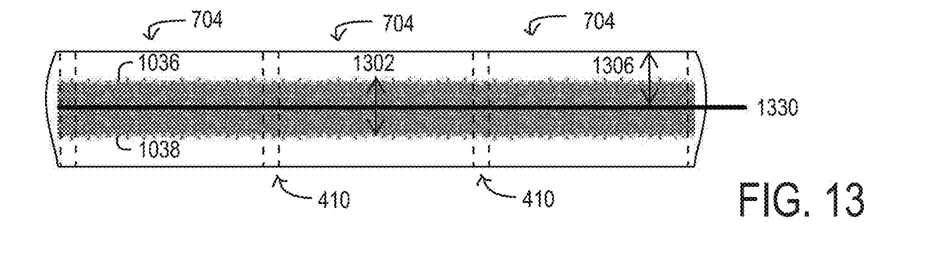

FIG. 13 shows an extended portion of the modification zone of FIG. 10, which is formed along the sidewalls of several device die 704 in a row or column that neighbors the present cutting lane 410. The extended portion of the modification zone has a midline 1330 centered between first and second boundaries 1036 and 1038. The midline 1330 corresponds to a path followed by the focal point position of the laser 822 as it passes through the present cutting lane 410, which in this example remains at a constant depth 1306 into the bulk silicon 416. The extended modification zone has a uniform thickness 1302 between first and second boundaries 1036 and 1038, and crosses several perpendicular cutting lanes 410 (shown with dashed vertical lines) between neighboring device die 704.

Figure 11:
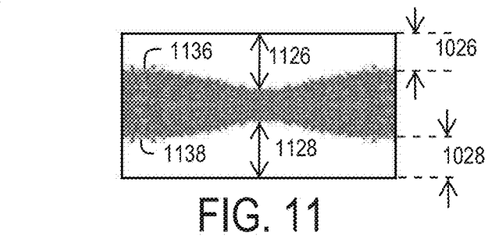

FIG. 11 shows a perpendicular cross-sectional view (also in a face-down orientation like that shown in FIG. 9) of a portion of an example modification zone formed in bulk silicon 416 using the variable stealth laser dicing process of the present disclosure. The portion of the modification zone shown in FIG. 11 is formed along the sidewall of a device die 704. In some embodiments, the portion of the modification zone may be achieved by varying the power level of the laser 822 as it passes through the present cutting lane 410 along the sidewall, with the power decreasing to some minimum power level as the laser 822 passes the center point of the sidewall and increasing to some maximum power level as the laser 822 approaches the end of the sidewall. In other embodiments, the portion of the modification zone may be achieved by varying the thickness of the heat zone around the focal point of the laser beam that forms the modification zone, with the thickness of the heat zone decreasing to a minimum thickness as the laser 822 passes the center point of the sidewall and increasing to a maximum thickness as the laser 822 approaches the end of the sidewall. Additional aspects about the laser system 822 that is used to achieve such a modification zone are further discussed below in connection with FIG. 22-28.

The first and second boundaries 1136 and 1138 of the modification zone "dip" or move toward the midline of the modification zone near the center point of the sidewall. This approach achieves larger thicknesses 1126 and 1128 of the remaining silicon layers 826 and 828 near the center point of the sidewall, as compared with the thicknesses 1026 and 1028 of the silicon layers 826 and 828 (shown in FIG. 9) near the ends of the sidewall. By increasing the thickness of the monocrystalline silicon layers near the center point of the sidewall, the fracture strength of the device die is increased, due to the monocrystalline silicon being able to withstand a greater amount of mechanical stress as compared with polycrystalline silicon. Proper die separation is still achieved due to the modification zone maintaining a minimum thickness near the center point and a required thickness near the ends of the sidewall for successful separation (where the ends of the sidewall represent the corners of the device die near intersections of the cutting lanes). The modification zone shown in FIG. 11 may also be referred to as a modulated modification zone.

Figure 14:
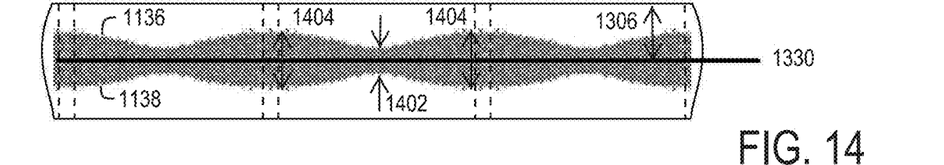

FIG. 14 shows an extended portion of the modification zone of FIG. 11, which is formed along the sidewalls of several device die 704 in a row or column that neighbors the present cutting lane 410. The extended portion of the modification zone has a midline 1330 centered between first and second boundaries 1136 and 1138. Midline 1330 of FIG. 14 corresponds to a path followed by the focal point position remaining at a constant depth 1306 into the bulk silicon 416 as the laser 822 passes through the present cutting lane 410. In some embodiments, the depth 1306 may be selected to be substantially half (or 50%) of the thickness of the wafer 302 (after backgrinding) measured from the back side of the wafer into the bulk silicon. For example, for a wafer 302 having a thickness in the range of 150 to 250 microns, the depth 1306 may be in the range of 75 microns to 125 microns. In other embodiments, depth 1306 may be selected from a range of 30% to 60% of the thickness of the wafer 302 measured from the back side of the wafer into the bulk silicon. For example, for a wafer 302 having a thickness of 200 microns, the depth 1306 may be in the range of 60 microns to 120 microns.

The extended modification zone shown in FIG. 14 has a thickness 1402 near a center point of each sidewall, which is less than the thickness 1404 of the modification zone near either end of the sidewall. The thickness 1404 near the sidewall ends is selected to be sufficient to achieve proper die separation. For example, for a wafer 302 having a thickness in the range of 150 to 250 microns, the thickness 1404 may be in the range of 50 microns to 100 microns. In some embodiments, the thickness 1402 near the sidewall center point is substantially half (50%) of the thickness 1404. For example, the thickness 1404 may be around 50 microns, while the thickness 1402 may be around 25 microns. In other embodiments, the thickness 1402 is substantially three-quarters (75%) of the thickness 1404, while in yet other embodiments, the thickness 1402 is substantially two-thirds (66%) of the thickness 1404.

Figure 12:
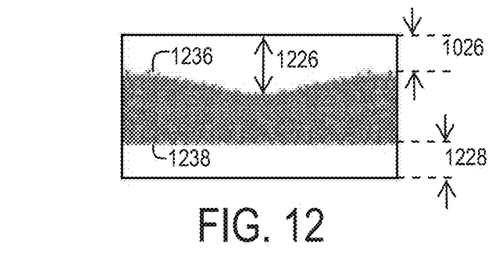

FIG. 12 shows a perpendicular cross-sectional view (also in a face-down orientation like that shown in FIG. 9) of a portion of another example modification zone formed in bulk silicon 416 using the variable stealth laser dicing process of the present disclosure. The portion of the modification zone shown in FIG. 12 is formed along the sidewall of a device die 704 and may be achieved by either varying the power level of the laser 822 or a thickness of the heat zone of the laser 822 in a manner similar to that shown in FIG. 11, while simultaneously varying the focal point position within the bulk silicon 416. The depth of the focal point increases into the bulk silicon 416 to some maximum depth as the laser 822 passes the center point of the sidewall and decreases to some minimum depth as the laser 822 approaches the end of the sidewall. Additional aspects about the laser system 822 that is used to achieve such a modification zone are further discussed below in connection with FIG. 22-23.

The first and second boundaries 1236 and 1238 of the modification zone "dip" toward the midline of the modification zone like in FIG. 11. However, as the depth of the focal point simultaneously changes, the midline of the modification zone moves deeper into the bulk silicon 416 near the center point of the sidewall, which flattens out second boundary 1238. This results in a larger thickness 1226 for silicon layer 826 near the center point of the sidewall, while maintaining a uniform thickness 1228 for silicon layer 828. By increasing the thickness of at least one of the remaining silicon layers near the center point of the sidewall, the fracture strength of the device die is increased. For example, if it is known that additional bending stress will be experienced by the back side 718 of the device die after it is packaged into a product (e.g., depending on fixed orientation of the device die in the product, such as one end of a smart card will always be inserted a certain way into a card reader), it may be beneficial to increase the thickness 1226 of the silicon layer 826 in order to increase the fracture strength of the device die on that side. Similarly, for the front side 414, it may be beneficial to increase the thickness of the silicon layer 828 to increase the fracture strength of the device die on that side. Proper die separation is still achieved due to the modification zone maintaining at least a minimum thickness near the center point and a required thickness near the ends of the sidewall for successful separation. The modification zone shown in FIG. 12 may also be referred to as a modulated modification zone.

Figure 15:
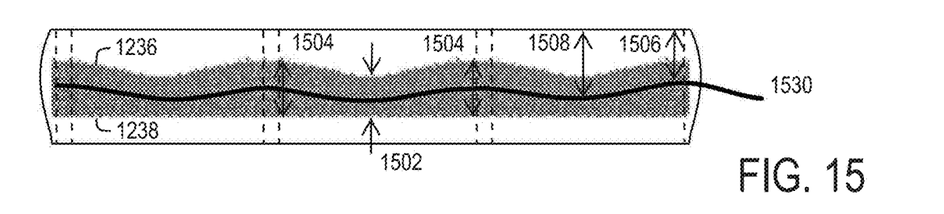

FIG. 15 shows an extended portion of the modification zone of FIG. 12, which is formed along the sidewalls of several device die 704 in a row or column that neighbors the present cutting lane 410. As described above, the laser focal point is driven deeper into the silicon as laser approaches the center point of die, while simultaneously reducing laser power to reduce the thickness of the modification zone near the center point, which forms an oscillating dip in the top boundary 1236 of the modification zone and a flat bottom boundary 1238. The extended portion of the modification zone has a midline 1530 centered between first and second boundaries 1236 and 1238, which corresponds to a path followed by the focal point position as it oscillates between a maximum depth 1508 into the bulk silicon 416 near the center point of each sidewall and a minimum depth 1506 near the ends of each sidewall. In some embodiments, the depths 1506 and 1508 are selected from a range of 30% to 60% of the thickness of the wafer 302 measured from the back side of the wafer into the bulk silicon. The extended modification zone has a thickness 1502 near a center point of each sidewall, which is less than the thickness 1504 of the modification zone near either end of the sidewall. The thickness 1504 near the sidewall ends is selected to be sufficient to achieve proper die separation. The thicknesses 1502 and 1504 have values comparable to the values of thicknesses 1402 and 1404 discussed above.

FIG. 16 illustrates a top-down view (e.g., showing the x-y plane) of the wafer 302 after modification zones (like those shown in FIG. 11-12 and FIG. 14-15) have been formed within each cutting lane 410 of the wafer 302. In other words, modification zones 1606 have been formed within each of cutting lanes 306(1)-(M) in the x-direction and modification zones 1608 have been formed within each of cutting lanes 308(1)-(N) in the y-direction. As shown, the wafer 302 is in a face-down orientation, with adhesive tape 520 attached to frame 1635, which is a film frame carrier and supports the wafer 302 during formation of the modification zones.

Further, the modification zones 1606 and 1608 may be formed in such a manner that avoids unwanted laser scattering at the intersections. For example, modification zones 1606 formed in cutting lanes 410 in the x-direction may have the shape shown in FIG. 14 across the wafer, using a maximum power level at every intersection with a y-directional cutting lane 410 (shown as a pair of vertical dashed lines). To avoid laser scattering, modification zones 1608 formed in cutting lanes 410 in the y-direction may then be further modulated to a minimum power level at the intersections. The modification zones 1608 in the y-direction would then have a shape similar to the shape shown in FIG. 14, with additional "dips" also present at every intersecting cutting lane 410 (resulting in "dips" present at both the center point of the sidewall and within each pair of vertical dashed lines). This approach would reduce laser scattering on the polycrystalline silicon already present in the intersection.

Figure 17:
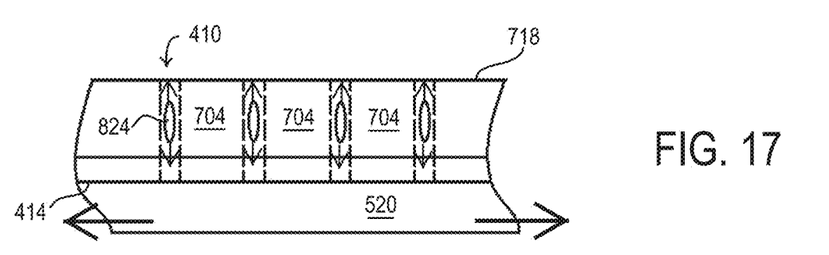
Figure 21:
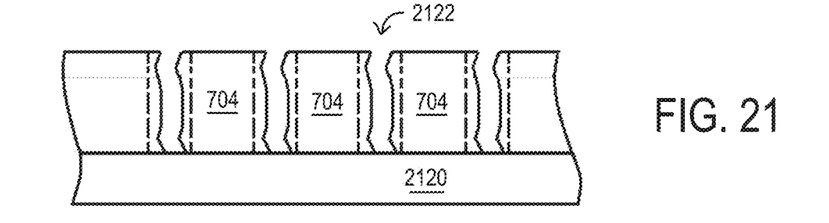

FIG. 17 illustrates a cross-sectional view of wafer 302 after the modification zones 824 have been formed within each of cutting lanes 410. In the embodiment shown, adhesive tape 520 is a dicing tape and is stretchable while remaining attached to each device die 704. After the modification zones 824 have been formed, the adhesive tape 520 is stretched in the x- and y-directions, which propagates cracks through each modification zone 824 in the z-direction towards both the front side 414 and the back side 718, as represented by up and down arrows in the z-direction (or vertical direction). As a result, the device die 704 are separated from one another in a manner like that shown in FIG. 21, with a gap 2122 created between each neighboring device die 704 (e.g., the gap 2122 is present between adjacent sidewalls of neighboring device die). The sidewalls of the separated device die 704 will have a remnant of the modification zone 824.

Figure 18:
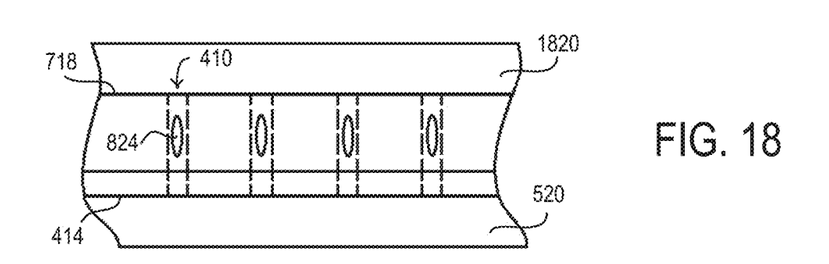
FIG. 18-21 illustrate block diagrams depicting alternative steps of the variable stealth laser dicing process in which the present disclosure is implemented, according to one embodiment.

FIG. 18-21 illustrate alternative steps of the variable stealth laser dicing process that implements the present disclosure. FIG. 18 illustrates a cross-sectional view of wafer 302 after the modification zones 824 have been formed within each of cutting lanes 410, where a dicing tape 1820 is attached to the back side 718 of the wafer 302. In the embodiment shown, adhesive tape 520 may be a protective foil or a dicing tape that protected the active device region 412 during the previous steps of the variable stealth laser dicing process, which needs to be removed before separating the device die 704.

Figure 19:
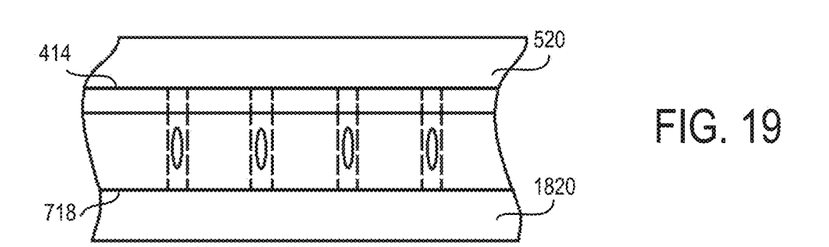
Figure 20:
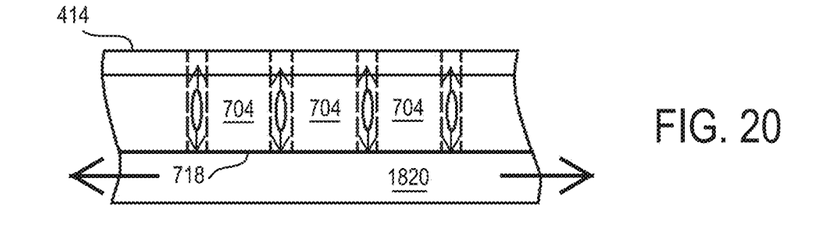

FIG. 19 illustrates a cross-sectional view of wafer 302 after flipping the wafer 302 to a face-up orientation, with front side 414 shown facing in an upward direction. FIG. 20 illustrates a cross-sectional view of wafer 302 after removing the adhesive tape 520 from the front side 414 of the wafer. As noted above, the adhesive tape 520 may include a release layer or may be removed after exposure to UV or temperature excursion. Once the adhesive tape 520 is removed, dicing tape 1820 is stretched in the x- and y-directions, which propagates cracks through each modification zone 824 in the x-direction towards both the front side 414 and the back side 718, as represented by up and down arrows in the z-direction (or vertical direction). As a result, the device die 704 are separated from one another in a manner like that shown in FIG. 21, with a gap 2122 present between each neighboring device die 704 (e.g., the gap 2122 is present between adjacent sidewalls of neighboring device die). The sidewalls of the separated device die 704 will have a remnant of the modification zone 824.

Figure 22:
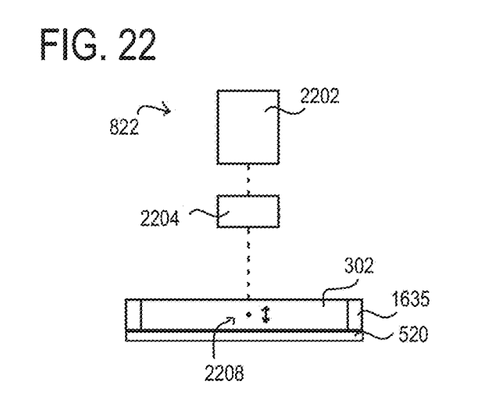
FIG. 22-24 illustrate block diagrams depicting aspects of example laser systems in which the present disclosure can be implemented, according to some embodiments.

FIG. 22 illustrates components of an example laser system 822 that can be used to form a modification zone 824, as discussed above. Laser system 822 includes a laser source 2202, optics 2204, and frame 1635. As shown, wafer 302 is mounted or attached face-down onto adhesive tape 520, which is attached to frame 1635. The laser system 822 may also include an infra-red or other imaging system to determine the position of the cutting lanes in the wafer 302. The laser system 822 also includes an output power modulator, which is further discussed below in connection with FIGS. 27 and 28.

Laser source 2202 produces a "raw" laser beam (illustrated as a dashed line) that is provided to optics 2204, which includes a lens that focuses the "raw" laser beam into a "finished" laser beam. The raw laser beam may be either a continuous wave laser beam or a pulsed laser beam (e.g., laser pulses provided at some frequency). The raw laser beam may be a Gaussian beam having greatest intensity near the center of the laser beam. The raw laser beam may have a visible light wavelength, an ultraviolet (UV) wavelength, or an infra-red (IR) wavelength.

Figure 24:
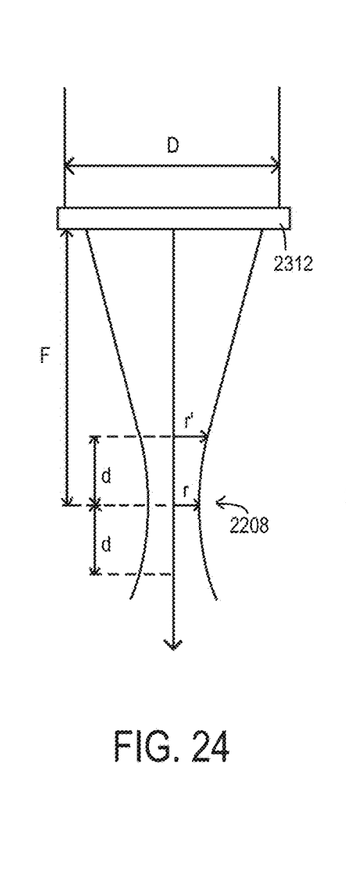

The laser beam has a cross-sectional shape similar to that shown in FIG. 24, where the raw laser beam has a diameter D. Lens 2312 focuses the finished laser beam to a focal point 2208 at some focal length F from the lens 2312. Both the raw and finished laser beams have a circular cross-section, where the finished laser beam has the smallest cross-sectional area (or is most narrow) at a focal point 2208 having some radius r. A heat zone is generated around the focal point 2208, which is measured from a distance d in front of and a distance d behind the focal point 2208 along the finished laser beam, resulting in a heat zone having a height or thickness of 2d. The finished laser beam will have a radius r' (or r prime) at distance d that will be larger than the radius r at the focal point 2208. Within the heat zone, the output power of the finished laser beam is great enough to melt monocrystalline silicon into polycrystalline silicon. Generally, the radius r of the focal point 2208 and the distance d of the heat zone depends on the diameter D of the raw laser beam and the focal length F of the lens 2312.

Returning to FIG. 22, laser system 822 passes the (finished) laser beam through the back side of the wafer 302 into a cutting lane, where the focal point 2208 of the laser beam is positioned within the bulk silicon at some depth into the bulk silicon, measured from the back side of the wafer 302. The laser system 822 is configured to dynamically adjust the position of the focal point 2208 in the vertical direction to increase or decrease the depth into the bulk silicon (illustrated by a bidirectional arrow in the z-direction next to the focal point 2208) as the laser beam moves or scans across the wafer 302 to form the desired shape of the modification zones in the cutting lanes. In some embodiments, the laser system 822 is configured to dynamically adjust the position of the frame 1635 to change the position of the focal point 2208. The laser system 822 is configured to scan across the wafer 302 at some scanning speed. For example, for a wafer having a die size in the range of 500 microns to 1 mm, the scanning speed may be set to approximately 300 mm/sec. In some embodiments, the laser system 822 is further configured to simultaneously move the focal point 2208 while also modulating or varying output power of the laser beam as it scans the wafer, in order to achieve the desired shape of the modification zone 824 as further discussed below.

Optics 2204 may also include other optical components to adjust other aspects of the laser beam, such as steering mirrors or waveguides for re-directing or guiding the laser beam within laser system 822, additional lenses for altering the wave front of the laser beam before striking the (final) lens to produce the finished laser beam, or an aperture for clipping the laser beam to pass only the central part of the laser beam as the finished beam.

Figure 23:
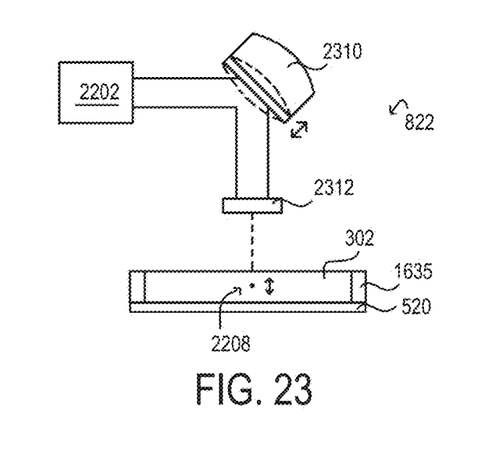

FIG. 23 illustrates components of another example laser system 822 that can be used to form a modification zone 824. As shown, laser system 822 includes a laser source 2202, adjustable optics 2310, lens 2312, and frame 1635. The wafer 302 is mounted or attached face-down onto adhesive tape 520, which is attached to frame 1635. The laser system 822 may also include an infra-red or other imaging system to determine the position of the cutting lanes in the wafer 302. The laser system 822 also includes an output power modulator, which is further discussed in connection with FIGS. 27 and 28.

As discussed above, laser source 2202 produces a raw laser beam that is provided to adjustable optics 2310, which includes an adjustable mirror. The surface shape of the adjustable mirror can be altered by changing the pressure on the back of the adjustable lens. For example, the adjustable mirror may have a concave surface without applied pressure. As applied pressure is increased, the surface shape changes from concave to flat, and then from flat to convex (illustrated by a bidirectional arrow next to the surface of the adjustable optics 2310). Since the distanced from the focal point 2208 (which corresponds to the thickness of the heat zone around the focal point 2208, which in turn corresponds to the thickness of the modification zone 824) is dependent on the diameter D of the raw laser beam, the thickness of the modification zone 824 can be changed as the adjustable mirror's surface shape changes and provides a different diameter D of the raw laser beam.

Like the laser system 822 shown in FIG. 22, the laser system 822 shown in FIG. 23 is also configured to dynamically adjust the position of the focal point 2208 in the vertical direction to increase or decrease the depth into the bulk silicon (illustrated by a bidirectional arrow in the z-direction next to the focal point 2208) as the laser beam moves or scans across the wafer 302 to form the desired shape of the modification zones in the cutting lanes. In some embodiments, the laser system 822 is configured to dynamically adjust the position of the frame 1635 to change the position of the focal point 2208. The laser system 822 is configured to scan across the wafer 302 at some scanning speed. For example, for a wafer having a die size in the range of 500 microns to 1 mm, the scanning speed may be set to approximately 300 mm/sec. In some embodiments, the laser system 822 is configured to simultaneously adjust the adjustable optics while moving the focal point 2208 in order to vary the thickness of the heat zone as it scans the wafer, in order to achieve the desired shape of the modification zone 824. In some embodiments, the laser system 822 is further configured to move the focal point 2208, adjust the adjustable optics, and modulate output power of the laser beam either individually or simultaneously as it scans the wafer, in order to achieve the desired shape of the modification zone 824 as further discussed below.

While FIGS. 8 and 9 and FIGS. 22 and 23 show a single laser beam forming a modification zone in one cutting lane for simplicity's sake, other embodiments of laser system 822 may implement multiple laser beams or may implement mirrored laser beams that can form multiple modification zones simultaneously in multiple cutting lanes of a wafer.

Additionally, while the above figures show a relatively continuous area of polycrystalline silicon within the modification zone (such as FIG. 10-15), it is noted that modification zone may also be achieved by a pulsed laser beam, where each pulse forms a portion or vertical strip of polycrystalline silicon of the modification zone. The differences in the distances between pulses are exaggerated in FIGS. 25 and 26 to show the pulsed nature of the laser beam and the resulting modification zone. In some embodiments, the laser is pulsed to form vertical strips that are immediately adjacent to one another and effectively form a continuous area of polycrystalline silicon within the modification zone.

Figure 25:
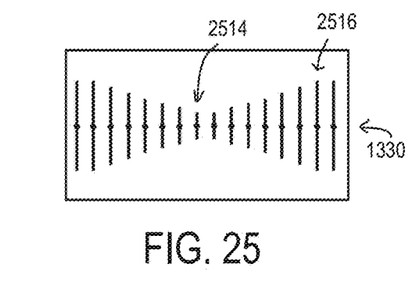
FIG. 25-26 illustrate block diagrams depicting example modification zones that can be implemented by the laser system of FIGS. 8 and 9, according to some embodiments.
Figure 26:
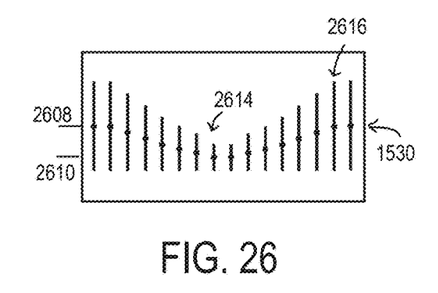

FIGS. 25 and 26 each show a perpendicular cross-sectional view of an example modification zone formed in bulk silicon using a pulsed laser beam in the variable stealth laser dicing process of the present disclosure. Each laser pulse of the pulsed laser beam creates a separate portion or vertical strip of the modification zone along the sidewall of a device die. The focal point of the pulsed laser beam is shown as a dot on each vertical strip. In FIG. 25, the midline 1330 of the modification zone shows that the position of the focal point is set at a constant depth into the bulk silicon. The modification zone shown in FIG. 25 has a similar shape to that shown in FIG. 11, where the thickness of the vertical strips similarly fall within first and second (or upper and lower) boundaries that "dip" toward the midline near the center point of the sidewall. In other words, the thickness (or height) of the vertical strip 2514 near the center point of the sidewall is less than the thickness (or height) of the vertical strip 2516 near the end of the sidewall.

In FIG. 26, the midline 1530 of the modification zone shows that the position of the focal point varies from an upper (or shallow) position 2608 to a lower (or deeper) position 2610 in the bulk silicon. The modification zone shown in FIG. 26 has a similar shape to that shown in FIG. 12, where the thickness of the vertical strips similarly fall within first and second (or upper and lower) boundaries, where the upper boundary shown in FIG. 26 dips down while the lower boundary shown in FIG. 26 flattens out due to the simultaneous adjustment of the focal point position as the thickness of the vertical strips changes. The thickness (or height) of the vertical strip 2614 near the center point of the sidewall is less than the thickness (or height) of the vertical strip 2616 near the end of the sidewall.

Figure 27:
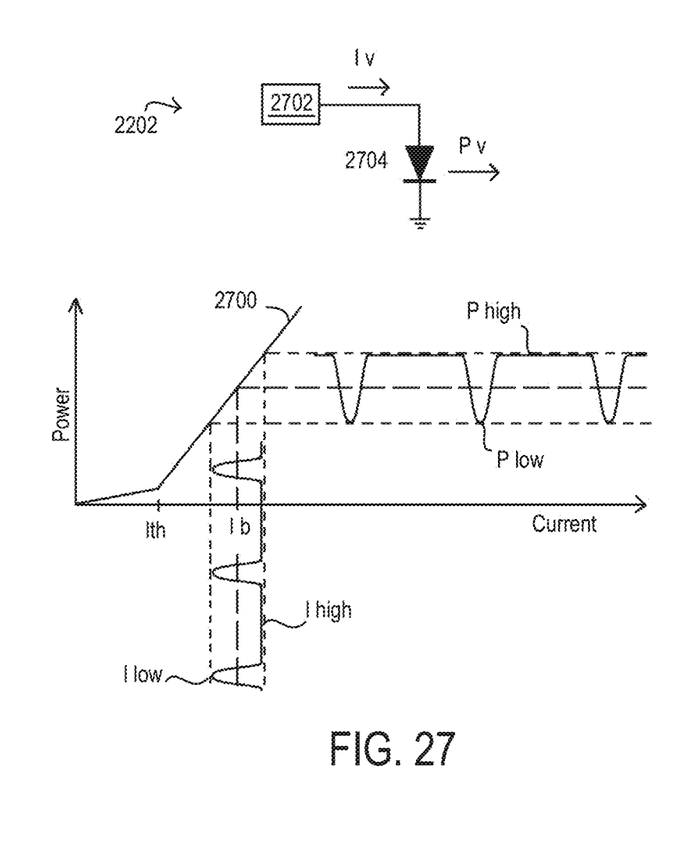
FIG. 27-28 illustrate block diagrams depicting aspects of varying output power of the laser system, according to some embodiments.

FIG. 27 shows example components of one embodiment of a laser source 2202 that generates a laser beam. In the embodiment shown, laser source 2202 includes a laser diode 2704, or an injection laser diode, that is electrically a PIN (p-type/intrinsic/n-type) diode, which generates the laser beam. The laser diode 2704 is connected to a variable current source 2702, which varies the current provided to the laser diode 2704 (labeled as Iv). The laser diode 2704 in turn outputs a variable power (labeled as Pv) based on the current Iv. An example modulated current curve and corresponding modulated output power curve is also shown in FIG. 27. The output power characteristic curve 2700 of the laser diode 2704 is shown as having a threshold current (labeled as Ith), above which the laser diode 2704 is on and outputs the laser beam. The variable current source 2702 biases the laser diode 2704 at a bias current (labeled as Ib) greater than the threshold current Ith to ensure that the laser beam is continuously output without turning the laser diode 2704 off. The current curve is shown in a vertical direction on the graph, which modulates or oscillates between a maximum current (labeled as Ihigh) and a minimum current (labeled as Ilow). The laser diode in turn outputs a power curve that is shown in a horizontal direction on the graph, which modulates or oscillates between a maximum power (labeled as Phigh) and a minimum power (labeled as Plow). The minimum current is provided to the laser diode 2704 to control the laser diode 2704 to output minimum power and create a thinner section of the modification zone where desired, such as near the center point of the sidewall of each device die.

Figure 28:
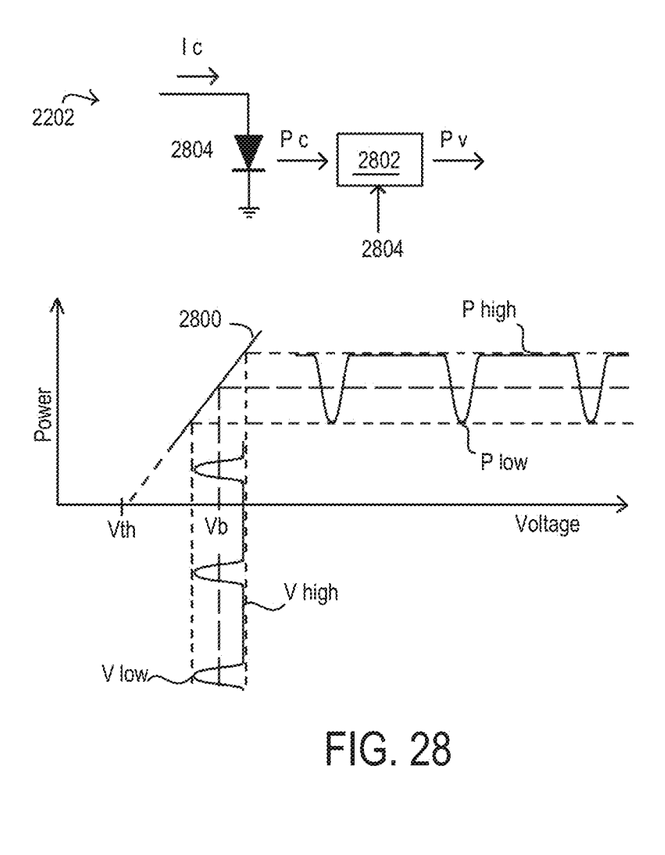

FIG. 28 shows example components of another embodiment of a laser source 2202 that generates a laser beam. In the embodiment shown, laser source 2202 includes a diode 2804, which may be an injection laser diode or may be a solid-state laser, which includes a glass or crystalline host material doped with a rare earth or transition metal element, such as neodymium, erbium, thulium, ytterbium, vanadium, or chromium. One example of a solid-state laser includes a Nd:YAG (neodymium-doped yttrium aluminum garnet) laser. The laser diode or solid-state laser 2804 is configured to output a continuous wave laser beam having a constant power (labeled as Pc). For example, if a laser diode is implemented, a constant current (labeled as Ic) is provided to the laser diode, which in turn outputs a constant power Pc. The laser beam is then provided to an external modulator 2802, which is configured to modulate or vary the power of the laser beam (labeled as Pv) in response to a varying control voltage 2804. An example modulated voltage curve and corresponding modulated output power curve is also shown in FIG. 28. The output power characteristic curve 2800 of the laser source 2202 shows that the external modulator 2802 outputs non-zero power above some threshold control voltage (labeled as Vth). The external modulator 2802 is configured to receive some control voltage offset by a bias voltage (labeled as Vb) which is greater than the threshold control voltage to ensure that the laser beam is continuously output without effectively turning the laser beam off. The voltage curve is shown in a vertical direction on the graph, which modulates or oscillates between a maximum control voltage (labeled as Vhigh) and a minimum control voltage (labeled as Vlow). The external modulator 2802 in turn outputs a power curve that is shown in a horizontal direction on the graph, which modulates or oscillates between a maximum power (labeled as Phigh) and a minimum power (labeled as Plow). For example, the minimum control voltage is provided to the external modulator 2802 as the laser beam to control the external modulator 2802 to output minimum power and create a thinner section of the modification zone where desired, such as near the center point of the sidewall of each device die.

By now it should be appreciated that there has been provided a device die separation solution that increases the fracture strength of device die that are separated by stealth laser dicing that implements modification zones that are created using oscillating laser power to create a thinner portion of the modification zone near the center point of at least one sidewall of the device die, oscillating focus position to create a modification zone having an outer or upper boundary that dips down near the center point of the at least one sidewall of the device die, or both.

In one embodiment of the present disclosure, a method for separating integrated circuit (IC) device die of a wafer is provided, the wafer having a front side with an active device region and a back side, the active device region having a plurality of active devices arranged in rows and columns and separated by cutting lanes, the method including: attaching the front side of the wafer onto a first dicing tape; forming a modification zone within each cutting lane through the back side of the wafer, wherein each modification zone has a first thickness near a corner of each active device and a second thickness near a center point of each active device, wherein the second thickness is less than the first thickness; and propagating cracks through each modification zone within each cutting lane to separate the plurality of active devices.

One aspect of the above embodiment provides that the modification zone has an oscillating thickness that changes between the first thickness and the second thickness along the path.

Another aspect of the above embodiment provides that the forming the modification zone within each cutting lane includes applying a laser beam through the back side of the wafer along a path within each cutting lane.

A further aspect of the above embodiment provides that the laser beam has a varying output power, wherein a first output power level corresponds to the first thickness, and a second output power level corresponds to the second thickness, and wherein the first output power level is greater than the second output power level.

Another further aspect of the above embodiment provides that the laser beam has a varying focal point position that changes between a first depth near the corner of each active device to a second depth near the center point of each active device along the path.

Another further aspect of the above embodiment provides that the first and second thicknesses of the modification zone depend upon a melting zone around a focal point of the laser beam.

Another further aspect of the above embodiment provides that the laser beam is pulsed to form a plurality of modification zone portions along the path.

Another further aspect of the above embodiment provides that the method further includes: varying an output power of the laser beam by varying a current provided to a light emitting diode that produces the laser beam.

Another further aspect of the above embodiment provides that the method further includes: varying an output power of the laser beam by varying a voltage provided to an external modulator, wherein a light emitting diode generates a continuous wave laser beam that is also provided to the external modulator.

Another further aspect of the above embodiment provides that the method further includes: varying a focal point position of the laser beam by adjusting a depth of a focal point of the laser beam into the back side of the wafer.

Another further aspect of the above embodiment provides that the method further includes: varying a focal point position of the laser beam by varying adjustable optics to change a focal point distance of the laser beam.

Another aspect of the above embodiment provides that the modification zone is located between a top layer of monocrystalline silicon and a bottom layer of monocrystalline silicon, and the modification zone includes polycrystalline silicon.

Another aspect of the above embodiment provides that the method further includes: backgrinding the back side of the wafer after attaching the front side of the wafer onto the protective foil.

Another aspect of the above embodiment provides that the propagating cracks further includes: stretching the first dicing tape to separate the plurality of active devices.

Another aspect of the above embodiment provides that the propagating cracks further includes: applying a second dicing tape to the back side of the wafer after forming the modification zone in each cutting lane, removing the first dicing tape from the front side of the wafer, and stretching the second dicing tape to separate the plurality of active devices.

In another embodiment of the present disclosure, a method for separating integrated circuit (IC) device die of a wafer is provided, the wafer having a front side with an active device region and a back side, the active device region having a plurality of active devices separated by one or more cutting lanes, the method including: attaching the front side of the wafer onto a protective foil; forming a modification zone within each cutting lane through the back side of the wafer, wherein each modification zone has an oscillating thickness, where a maximum thickness is located near a corner of each active device and a minimum thickness is located near a center point of each active device; and propagating cracks through each modification zone within each cutting lane to separate the plurality of active devices.

One aspect of the above embodiment provides that the propagating cracks further includes: applying a dicing tape to the back side of the wafer after forming the modification zone within each cutting lane, removing the protective foil from the front side of the wafer, and stretching the dicing tape to separate the plurality of active devices.

Another aspect of the above embodiment provides that the forming the modification zone within each cutting lane includes applying a laser beam through the back side of the wafer along a path within each cutting lane.

A further aspect of the above embodiment provides that the method of claim 18, further includes: controlling the laser beam to have an oscillating output power that changes between a maximum output power level near the corner of each active device and a minimum output power level near the center point of each active device along the path.

Another further aspect of the above embodiment provides that the method further includes: controlling the laser beam to have an oscillating focal point position that changes between a minimum depth near the corner of each active device to a maximum depth near the center point of each active device along the path.

In another embodiment of the present disclosure, an integrated circuit (IC) is provided, which includes: an active device region on a top side of the IC; and sidewalls perpendicular to the top side of the IC, wherein at least one sidewall includes a zone of polycrystalline silicon having a minimum thickness located near a center point of the sidewall and a maximum thickness near a corner of the IC.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is noted that the term "neighboring" as used herein means one type of object is "laterally and immediately adjacent" to another object of the same type (e.g., next to, without another intervening object of the same type).

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication or during any steps of the variable stealth laser dicing processing, which are not significant for the stated purpose or value.

Although the invention is described herein with reference to specific embodiments, various modifications and changes can be made without departing from the scope of the present invention as set forth in the claims below. For example, additional or fewer device die may be implemented in the wafer of FIG. 3. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for separating integrated circuit (IC) device die of a wafer, the wafer having a front side with an active device region and a back side, the active device region having a plurality of active devices arranged in rows and columns and separated by cutting lanes, the method comprising:
   attaching the front side of the wafer onto a first dicing tape;
   forming a modification zone within each cutting lane through the back side of the wafer by applying a laser beam through the back side of the wafer along a path within each cutting lane, wherein
      each modification zone has a first thickness near a corner of each active device and a second thickness near a center point of each active device,
      the second thickness is less than the first thickness,
      the laser beam has a varying output power,
      a first output power level corresponds to the first thickness,
      a second output power level corresponds to the second thickness, and
      the first output power level is greater than the second output power level; and
   propagating cracks through each modification zone within each cutting lane to separate the plurality of active devices.

2. The method of claim 1, wherein the modification zone has an oscillating thickness that changes between the first thickness and the second thickness along the path.

3. The method of claim 1, wherein the laser beam has a varying focal point position that changes between a first depth near the corner of each active device to a second depth near the center point of each active device along the path.

4. The method of claim 1, wherein the first and second thicknesses of the modification zone depend upon a melting zone around a focal point of the laser beam.

5. The method of claim 1, wherein the laser beam is pulsed to form a plurality of modification zone portions along the path.

6. The method of claim 1, further comprising:
   varying an output power of the laser beam by varying a current provided to a light emitting diode that produces the laser beam.

7. The method of claim 1, further comprising:
   varying an output power of the laser beam by varying a voltage provided to an external modulator, wherein a light emitting diode generates a continuous wave laser beam that is also provided to the external modulator.

8. The method of claim 1, further comprising:
   varying a focal point position of the laser beam by adjusting a depth of a focal point of the laser beam into the back side of the wafer.

9. The method of claim 1, further comprising:
   varying a focal point position of the laser beam by varying adjustable optics to change a focal point distance of the laser beam.

10. The method of claim 1, wherein the modification zone is located between a top layer of monocrystalline silicon and a bottom layer of monocrystalline silicon, and the modification zone comprises polycrystalline silicon.

11. The method of claim 1, further comprising:
    backgrinding the back side of the wafer after attaching the front side of the wafer onto a protective foil.

12. The method of claim 1, wherein the propagating cracks further comprises:
    stretching the first dicing tape to separate the plurality of active devices.

13. The method of claim 1, wherein the propagating cracks further comprises:
    applying a second dicing tape to the back side of the wafer after forming the modification zone in each cutting lane,
    removing the first dicing tape from the front side of the wafer, and
    stretching the second dicing tape to separate the plurality of active devices.

14. A method for separating integrated circuit (IC) device die of a wafer, the wafer having a front side with an active device region and a back side, the active device region having a plurality of active devices separated by one or more cutting lanes, the method comprising:
    attaching the front side of the wafer onto a protective foil;
    forming a modification zone within each cutting lane through the back side of the wafer by:
       applying a laser beam through the back side of the wafer along a path within each cutting lane, wherein each modification zone has an oscillating thickness, wherein a maximum thickness is located near a corner of each active device and a minimum thickness is located near a center point of each active device, and
       controlling the laser beam to have an oscillating output power that changes between a maximum output power level near the corner of each active device and a minimum output power level near the center point of each active device along the path; and
    propagating cracks through each modification zone within each cutting lane to separate the plurality of active devices.

15. The method of claim 14, wherein the propagating cracks further comprises:
    applying a dicing tape to the back side of the wafer after forming the modification zone within each cutting lane,
    removing the protective foil from the front side of the wafer, and
    stretching the dicing tape to separate the plurality of active devices.

16. The method of claim 14, further comprising:
    controlling the laser beam to have an oscillating focal point position that changes between a minimum depth near the corner of each active device to a maximum depth near the center point of each active device along the path.

* * * * *